United States Patent
Liebmann et al.

(10) Patent No.: US 11,201,148 B2
(45) Date of Patent: Dec. 14, 2021

(54) ARCHITECTURE FOR MONOLITHIC 3D INTEGRATION OF SEMICONDUCTOR DEVICES

(71) Applicant: TOKYO ELECTRON LIMITED, Tokyo (JP)

(72) Inventors: Lars Liebmann, Mechanicville, NY (US); Jeffrey Smith, Clifton Park, NY (US); Anton J. deVilliers, Clifton Park, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 14 days.

(21) Appl. No.: 16/667,442

(22) Filed: Oct. 29, 2019

(65) Prior Publication Data
US 2020/0135718 A1    Apr. 30, 2020

Related U.S. Application Data

(60) Provisional application No. 62/752,112, filed on Oct. 29, 2018.

(51) Int. Cl.
*H01L 27/06* (2006.01)
*H01L 23/528* (2006.01)
(Continued)

(52) U.S. Cl.
CPC ...... *H01L 27/0688* (2013.01); *H01L 21/8221* (2013.01); *H01L 21/823871* (2013.01);
(Continued)

(58) Field of Classification Search
CPC ............. H01L 27/0688; H01L 23/5286; H01L 23/535; H01L 23/5226; H01L 21/8221
See application file for complete search history.

(56) References Cited

U.S. PATENT DOCUMENTS 9,070,552 B1 *  6/2015  Shah ................. H01L 27/11807
9,171,608 B2   10/2015  Xie et al.
(Continued)

FOREIGN PATENT DOCUMENTS

WO  WO 2017/196458 A1  11/2017
WO  WO 2017/220968 A1  12/2017

OTHER PUBLICATIONS

International Search Report and Written Opinion dated Feb. 13, 2020, in PCT/US2019/058554, 9 pages.

*Primary Examiner* — Sarah K Salerno
(74) *Attorney, Agent, or Firm* — Oblon, McClelland, Maier & Neustadt, L.L.P.

(57) ABSTRACT

A three-dimensional (3D) integrated circuit (IC) includes a substrate having a substrate surface, a power rail provided in the substrate, and a first tier of semiconductor devices provided in the substrate and positioned over the power rail along a thickness direction of the substrate. A wiring tier is provided in the substrate, and a second tier of semiconductor devices is provided in the substrate and positioned over the wiring tier along the thickness direction. The second tier of semiconductor devices is stacked on the first tier of semiconductor devices in the thickness direction such that the wiring tier is interposed between the first and second tiers of semiconductor devices. A first vertical interconnect structure extends downward from the wiring tier to the first tier of semiconductor devices to electrically connect the wiring tier to a device within the first tier of semiconductor devices. A second vertical interconnect structure extends upward from the wiring tier to the second tier of semiconductor devices to electrically connect the wiring tier to a device within the second tier of semiconductor devices.

18 Claims, 5 Drawing Sheets

(51) Int. Cl.
    *H01L 23/522*     (2006.01)
    *H01L 21/8238*     (2006.01)
    *H01L 27/11*     (2006.01)
    *H01L 21/822*     (2006.01)
    *H01L 27/092*     (2006.01)

(52) U.S. Cl.
    CPC ...... *H01L 23/5226* (2013.01); *H01L 23/5286* (2013.01); *H01L 27/092* (2013.01); *H01L 27/1104* (2013.01); *H01L 27/1116* (2013.01)

(56) References Cited

U.S. PATENT DOCUMENTS

| | | |
|---|---|---|
| 9,431,300 B1 * | 8/2016 | Zeng .................. H01L 27/0207 |
| 9,583,179 B2 | 2/2017 | Xie et al. |
| 9,691,695 B2 | 6/2017 | Guo et al. |
| 9,754,923 B1 * | 9/2017 | Xie ........................ H01L 24/13 |
| 9,929,149 B2 | 3/2018 | Sinha et al. |
| 10,134,729 B2 | 11/2018 | Yang |
| 10,170,404 B2 | 1/2019 | Guo et al. |
| 2014/0269022 A1 | 9/2014 | Xie et al. |
| 2015/0091130 A1 | 4/2015 | Yang |
| 2015/0302919 A1 | 10/2015 | Xie et al. |
| 2017/0062319 A1 | 3/2017 | Guo et al. |
| 2017/0287826 A1 | 10/2017 | Guo et al. |
| 2017/0365600 A1 | 12/2017 | Sinha et al. |
| 2019/0088644 A1 | 3/2019 | Yang |
| 2019/0131230 A1 | 5/2019 | Guo et al. |

* cited by examiner

ARCHITECTURE FOR MONOLITHIC 3D INTEGRATION OF SEMICONDUCTOR DEVICES

CROSS REFERENCE TO RELATED APPLICATIONS

This application claims the benefit of U.S. Provisional Application No. 62/752,112 filed on Oct. 29, 2018, the entire contents of which is incorporated herein by reference.

FIELD OF THE INVENTION

The disclosure relates to microelectronic devices including semiconductor devices, transistors, and integrated circuits, including methods of microfabrication.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Integrated circuits are widely used in the electronics industry to provide electronic devices such as smart phones, computers, and the like. Integrated circuits (ICs) include many semiconductor devices, such as transistors, capacitors and the like, which are interconnected by wiring on a semiconductor substrate. There is an ever increasing demand for smaller and faster ICs that support a greater number of complex functions for electronics devices. This demand has led to the semiconductor manufacturing industry scaling down the area of ICs on the substrate, while also improving performance and power consumption efficiencies for the IC.

In the manufacture of a semiconductor ICs (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors of the IC have been created in one plane, with wiring/metallization of the IC formed above the active device plane, and have thus been characterized as two-dimensional (2D) circuits or 2D fabrication. Scaling efforts have greatly increased the number of transistors per unit area in 2D circuits, which has enabled the integration of heterogeneous functional circuits, such as logic and memory circuits, onto the same semiconductor substrate. However, 2D scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other as another means of further scaling of ICs.

SUMMARY

Techniques herein provide an architecture that is a true monolithic 3D integration of different functional circuits, such as logic and memory. Techniques also include an integration flow for monolithically integrated three-dimensional devices. Designs herein include integrating memory over a logic stack. Techniques include integrating multiple different semiconductor devices over each other without stacking wafer or substrate segments on top of each other.

According to an aspect of the disclosure, a three-dimensional (3D) integrated circuit (IC) is provided. The 3D IC includes a substrate having a substrate surface, a power rail provided in the substrate, and a first tier of semiconductor devices provided in the substrate and positioned over the power rail along a thickness direction of the substrate which is substantially perpendicular to the substrate surface. A wiring tier is provided in the substrate and positioned over the first tier of semiconductor devices along the thickness direction. A second tier of semiconductor devices provided in the substrate and positioned over the wiring tier along the thickness direction, the second tier of semiconductor devices being stacked on the first tier of semiconductor devices in the thickness direction such that the wiring tier is interposed between the first and second tiers of semiconductor devices. A first vertical interconnect structure extends downward from the wiring tier to the first tier of semiconductor devices along the thickness direction to electrically connect the wiring tier to a device within the first tier of semiconductor devices. A second vertical interconnect structure extending upward from the wiring tier to the second tier of semiconductor devices along the thickness direction to electrically connect the wiring tier to a device within the second tier of semiconductor devices.

In some aspects of the disclosure, the wiring tier of the 3D IC can include two or more wiring levels positioned over one another along the thickness direction of the substrate.

In another aspect of the disclosure, the first tier of semiconductor devices includes a first transistor pair including an n-type transistor and a p-type transistor that are stacked over one another, and the second tier of semiconductor devices includes a second transistor pair including an n-type transistor and a p-type transistor that are stacked over one another. The 3D IC of this aspect may provide the first transistor pair and the second transistor pair configured in an alternating stack orientation. Alternatively, the first transistor pair can include a first common gate structure, and the second transistor pair can includes a second common gate structure.

In another aspect of the disclosure, devices in each of the first and second tier of semiconductor devices are stacked collinearly along the thickness direction to define an active device column, and the first and second vertical interconnects are provided outside of the active device column. In this aspect, the active device column may extend along the substrate surface of the substrate to define an active device region of the substrate surface, and the wiring tier can include a plurality of wiring tracks that substantially surround the active device region of the substrate surface. Further, the plurality of wiring tracks can include first wiring tracks provided within source-drain regions of the active device region, and which extend along the substrate surface in substantially parallel relation to gate regions of the active device region. The plurality of wiring tracks can further include second wiring tracks which extend along the substrate surface in substantially perpendicular relation to the gate regions of the active device region.

In other aspects of the disclosure, the 3D IC can further include an intermediate power rail provided in the substrate and positioned over the power rail along the thickness direction of the substrate.

In still another aspect, the 3D IC can include a third tier of semiconductor devices provided in the substrate and stacked on the second tier of semiconductor devices in the thickness direction. In this aspect, the intermediate power rail is provided in the substrate and positioned over the second tier of semiconductor devices such that the intermediate power rail is positioned between the second and third tiers of semiconductor devices along the thickness direction. The 3D IC of this aspect can further include a first power connection structure extending upward from the power rail to the first tier of semiconductor devices along the thickness direction to electrically connect the power rail to the device within the first tier of semiconductor devices. A second power connection structure can be provided to extend downward from the intermediate power rail to the second tier of semiconductor devices along the thickness direction to electrically connect the intermediate power rail to the device within the second tier of semiconductor devices. A third power connection structure can extend upward from the intermediate power rail to the third tier of semiconductor devices along the thickness direction to electrically connect the intermediate power rail to a device within the third tier of semiconductor devices.

An additional aspect of the disclosure provides a first tier of semiconductor devices includes a first stacked pair of complementary field effect transistors sharing a common gate structure, a second tier of semiconductor devices includes a second stacked pair of complementary field effect transistors sharing a common gate structure. A third tier of semiconductor devices can include a third stacked pair of complementary field effect transistors sharing a common gate structure, and an additional transistor stacked over the third stacked pair of complementary field effect transistors. The first second and third stacked pairs of complementary field effect transistors are stacked in relation to one another. According to this aspect, the first stacked pair of complementary field effect transistors has an n-over-p orientation, the second stacked pair of complementary field effect transistors has a p-over-n orientation, and the third stacked pair of complementary field effect transistors has an n-over-p orientation. The third tier of semiconductor devices may further include an n-type field effect transistor stacked on the third stacked pair of complementary field effect transistors. Further aspect provide that the first tier of semiconductor devices includes a first logic circuit, the second tier of semiconductor devices includes a second logic circuit, and the third tier of semiconductor devices includes a memory circuit. In one example IC, the first logic circuit is an And-Or-Inverter (AOI) circuit, the second logic circuit is an Exclusive-Or (XOR) circuit, and the memory circuit is an SRAM circuit.

According to another aspect of the disclosure, a method of forming a three-dimensional (3D) integrated circuit (IC) is provided. The method includes providing a substrate having a working surface, forming a power rail on the surface, forming a first tier of semiconductor devices on the surface over the power rail and forming a wiring tier on the surface over the first tier of semiconductor devices. A second tier of semiconductor devices is formed on the surface over the wiring tier and stacked on the first tier of semiconductor devices such that the wiring tier is interposed between the first and second tiers of semiconductor devices. A first vertical interconnect structure is formed extending downward from the wiring tier to the first tier of semiconductor devices to electrically connect the wiring tier to a device within the first tier of semiconductor devices. A second vertical interconnect structure is formed extending upward from the wiring tier to the second tier of semiconductor devices to electrically connect the wiring tier to a device within the second tier of semiconductor devices. Each of the forming steps is performed within a continuous process flow to form the 3D IC. This aspect may provide the first and second tiers of semiconductor devices as operational circuits from each other.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

As noted in the Background, semiconductor device fabricators have expressed a desire for three-dimensional (3D) semiconductor circuits in which transistors are stacked on top of each other as another means of scaling ICs, in addition to conventional 2D scaling. A 3D integration, i.e. the vertical stacking of semiconductor devices, aims to overcome 2D scaling limitations by increasing transistor density in volume rather than area. Although device stacking has been successfully demonstrated and implemented by the flash memory industry with the adoption of 3D NAND, application to random logic designs is substantially more difficult. 3D integration for logic chips such as CPUs (central processing units), GPUs (graphics processing units), FPGA (field programmable gate arrays) and SoCs (System on a chip) is being pursued primarily by two approaches: one approach is heterogeneous stacking, and the other approach is more of a homogeneous stacking.

An example of heterogeneous 3D integration using wafer/chip stacking and through silicon via (TSV) technology is disclosed in *Process Integration Aspects enabling 3D sequential stacked planar and FINfet Technology*, Anne VanDooren, IMEC PTW Spring 2018. In this 3D integration approach, each chip is optimized in design and manufacturing for a different specific task. The separately manufactured chips are then integrated by efficient packaging technology to build a stacked SoC. Details of heterogeneous integration approaches are provided the Heterogeneous Integration Roadmap, 2019 Edition published October 2019 at eps.iee.org/hir.

An example of the homogeneous stacking approach is disclosed in *Monolithic 3D IC: The Time is Now*, Brian Cronquist and Zvi Or-Bach, Monolithic, 2014 Intl. Workshop on Data-Abundant System Technology, April 2014. This approach employs a wafer bonding process to overcome density loss associated with micron-sized TSVs that are used in chip stacking. With the bonding approach, a base wafer is processed to form devices and several layers of metallization/wiring. Then, a thinned SoI (Silicon on insulator) layer is positioned on top of the base wafer and bonded thereto. Better inter-tier connectivity can be achieved with this wafer bonding method due to significantly smaller dimensions in the required via (~100 nm pitch) as compared to the chip stacking heterogeneous approach noted above. However, the present inventors recognized that this approach is not a true monolithic integration because independently processed wafers or wafer segments are stacked on top of each other. Thus, the wafer bonding method does not offer a true scaling solution for semiconductor fabrication. Moreover, process complexity and cost overhead associated with this wafer bonding process fall short of the scaling targets associated with true monolithic 3D integration.

Techniques disclosed herein provide true monolithic 3D integration of semiconductor devices such as logic and memory. Monolithic 3D integration is provided in that designs include vertically integrated multi-layer logic and memory built in one continuous process flow enabled by superposition of all active devices in a single column. Such true columnar fabrication reduces manufacturing cost (because there is only single wafer processing) and improved density (use of self-aligned and fully-aligned vias throughout the integrated stack).

Figure 1:
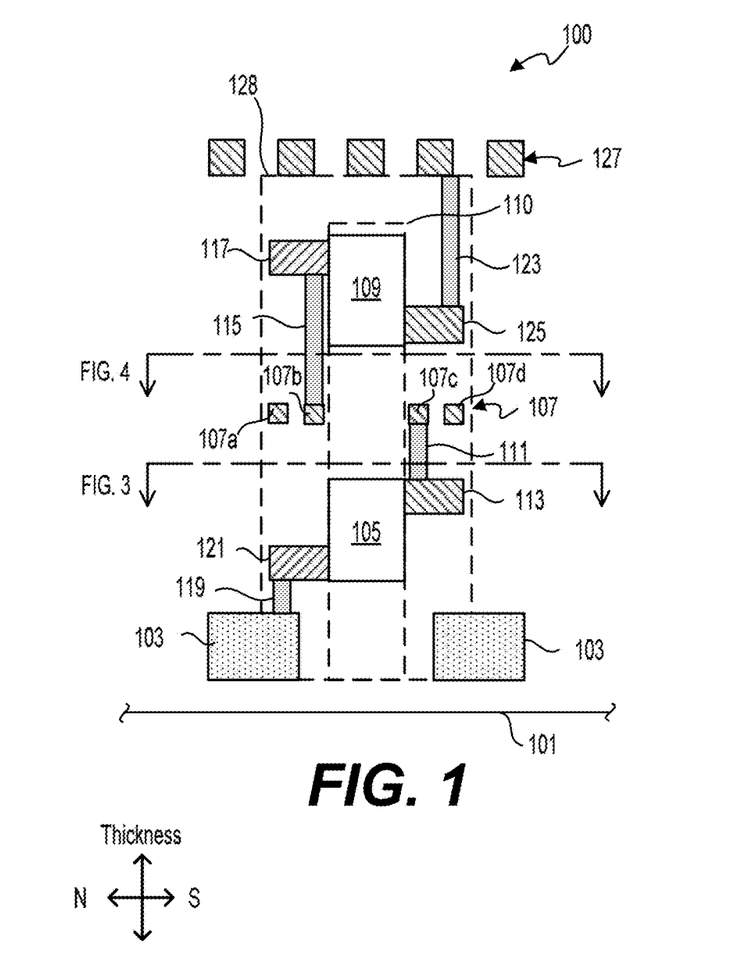
FIG. 1 is a vertical section view representing source-drain planes of 3D IC, in accordance with embodiments of the present disclosure.

FIG. 1 is a vertical section view representing source-drain planes of 3D IC, in accordance with embodiments of the present disclosure. As seen, the structure 100 includes power rails 103 provided in the substrate, which may be associated with low voltage (VSS) and high voltage (VDD) power delivery to the 3D IC. The power rails 103 may be considered "buried power rails" in that they are located below the active device plane. A lower tier of semiconductor devices 105 is provided in the substrate over the power rail 103 along a thickness direction of the substrate which is substantially perpendicular to the substrate surface 101. The lower tier of devices may include one or more semiconductor devices, such as field effect transistors (FETs), that form a functional circuit, such as a logic circuit or a memory circuit. Further, the FETs may be n-type or p-type FETS that are arranged along the substrate surface or stacked vertically over one another along the thickness direction of the substrate.

A wiring tier 107 is provided in the substrate and positioned over the lower tier of semiconductor devices 105. The wiring tier 107 includes one or more wiring layers, with each wiring layer including one or more wiring tracks that extend in a direction along the substrate surface 101. Generally, wiring tracks in one wiring layer will run in a direction perpendicular to the direction of wiring tracks in an adjacent wiring layer as discussed further below. In the embodiment of FIG. 1, the wiring tier 107 includes a single wiring layer having four wiring tracks 107a, 107b, 107c and 107d that extend in a direction perpendicular to a north-south direction along the substrate surface (i.e., perpendicular to the plane of the drawing page).

Structure 100 also includes an upper tier of semiconductor devices 109 positioned over the wiring tier 107 along the thickness direction. As with the lower tier, the upper tier of devices may include one or more semiconductor devices, such as n-type or p-type FETs arranged laterally or stacked over one another, to form a functional circuit. In some embodiments, the lower tier 105 and the upper tier 109 implement different functional circuits. As seen in FIG. 1, the upper tier of semiconductor devices 109 is stacked on the lower tier of semiconductor devices 105 in the thickness direction such that the wiring tier 107 is interposed between the lower and upper tiers of semiconductor devices. The device tiers 105 and 109 are depicted in FIG. 1 as collinearly aligned in a vertical direction within a device column 110. However, one skilled in the art would understand that these stacked tiers may not be perfectly aligned due to variability in manufacturing processes, lithography resolution limits, pattern placement error, etc.

Wiring tracks in the wiring tier 107 are electrically connected to devices within the lower and upper device tiers by way of local interconnects, such as vertical and horizontal interconnects. FIG. 1 is intended to depict the source-drain regions of FET devices having laterally arranged source, drain and channel regions within a respective tier of the IC. Thus, FIG. 1 is not a true a true cross-section through a plane that intersects a single source-drain region of FETs within each of the first and second tiers, but rather provides a representational view of both source-drain regions of FETs that would occupy different vertical planes in an actual physical device. In the embodiment of FIG. 1, first vertical interconnect 111 electrically connects the wiring tier 107 to the first tier of semiconductor devices 105. Specifically, the vertical interconnect 111 has a first end connected to wiring track 107*c* of the wiring tier 107 and extends downward along the thickness direction of the substrate. A second end of the vertical interconnect 111 is connected to horizontal interconnect 113 which is connected to a source-drain region of a device within the lower tier of devices 105. Thus, the vertical interconnect 111 serves as a source-drain contact to the wiring track 107*c* which may be routed to another device within the structure 100 by way of other local interconnect structures.

A second vertical interconnect 115 electrically connects the wiring tier 107 to the upper tier of semiconductor devices 109. In the example shown, the vertical interconnect 115 has a first end connected to wiring track 107*b* of the wiring tier 107 and extends upward along the thickness direction of the substrate. A second end of the vertical interconnect structure 115 is connected to horizontal interconnect structure 117 which is connected to a SD region of a device within the upper tier of devices 109. Thus, the vertical interconnect 115 serves as a source-drain contact to wiring track 107*b* which may be routed to another device within the structure 100 by way of other local interconnect structures.

Other local interconnect structures may be used based on electrical connections necessary for a particular circuit design and function. For example, power rail 103 is electrically connected to a device in the lower tier 105 by way of vertical interconnect 119 and horizontal interconnect 121 which is connected to a SD region of a device within the lower tier of devices 105. Thus, the vertical interconnect 119 serves as a power contact to deliver power to the lower tier of devices. Similarly, a device in the upper tier 109 is connected to global wiring within global wiring tier 127 by way of horizontal interconnect 125 and vertical interconnect 123. While not shown in FIG. 1, power contacts may be used to connect devices in the upper tier 109 with the power rails 103, with upper power rails at the global wiring tier 127, or with intermediate power rails as discussed below. Further, vias may be used to connect wiring tracks to one another when the wiring tier 107 includes multiple wiring layers.

Figure 2:
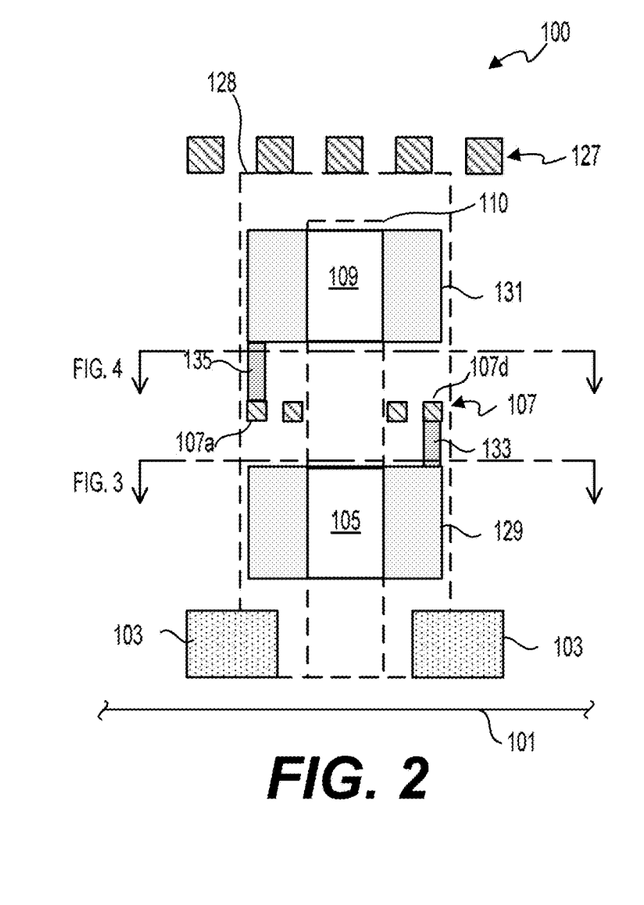
FIG. 2 is a vertical section view representing gate planes of the 3D IC of FIG. 1, in accordance with embodiments of the present disclosure.

FIG. 2 is a vertical section view representing gate planes of the 3D IC of FIG. 1, in accordance with embodiments of the present disclosure. The structure 100 represents a portion of a monolithic semiconductor substrate having a generally planar substrate surface 101. FIG. 2 is a cross-section through a gate track of the stacked tiers of semiconductor devices. As understood by those skilled in the art, the gate section in FIG. 2 is located in a plane between the laterally spaced source-drain regions of the IC represented by FIG. 1.

As seen in FIG. 2, the structure 100 includes a first gate region 129 associated with the first tier of semiconductor devices 105, and a second gate region 131 associated with the second tier of semiconductor devices. Each of the gate regions 129 and 131 may be a conductive gate all around GAA structure that surrounds one or more channel regions associated with devices within the respective tier. The GAA structure may be a common gate structure for two semiconductor devices within a tier, as discussed further below.

According to embodiments of this disclosure, wiring tier 107 may be electrically connected to the gates of devices within the first and second tiers 105 and 109. For example, vertical interconnect 133 electrically connects the wiring track 107*d* of wiring tier 107 to the gate region 129, and vertical interconnect 135 electrically connects the wiring track 107*a* of wiring tier 107 to the gate region 131. Thus, the vertical interconnects 133 and 135 service a gate contacts for wiring tracks 107*a* and 107*d* which may be routed to another device within the structure 100 by way of other local interconnect structures.

Figure 3:
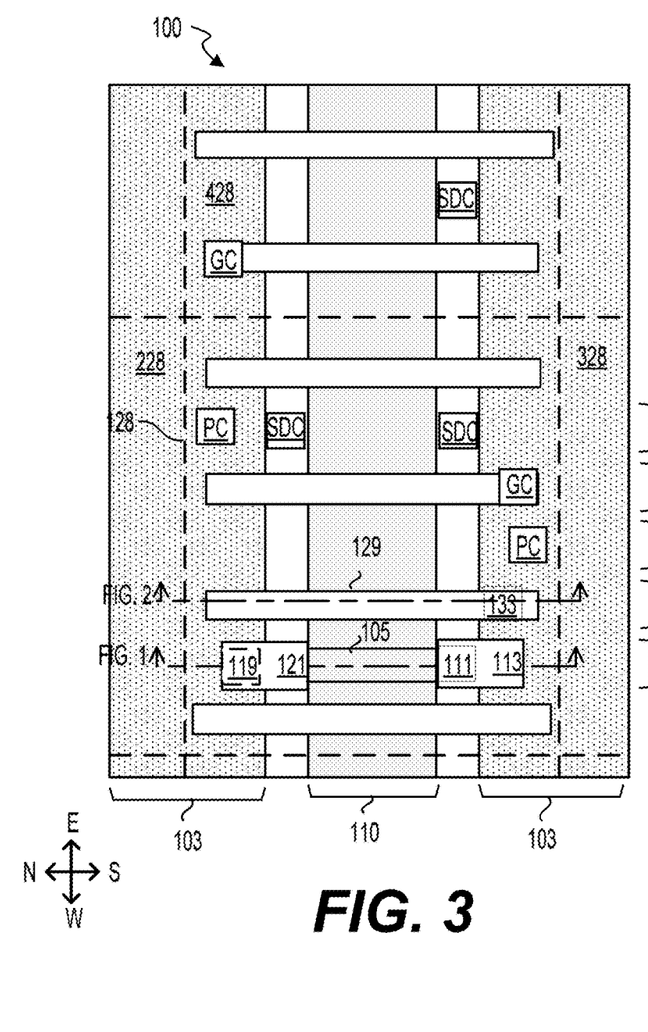
FIG. 3 is a top-down planar view of a horizontal section of the structure in FIGS. 1 and 2, in accordance with embodiments of the disclosure.
Figure 4:
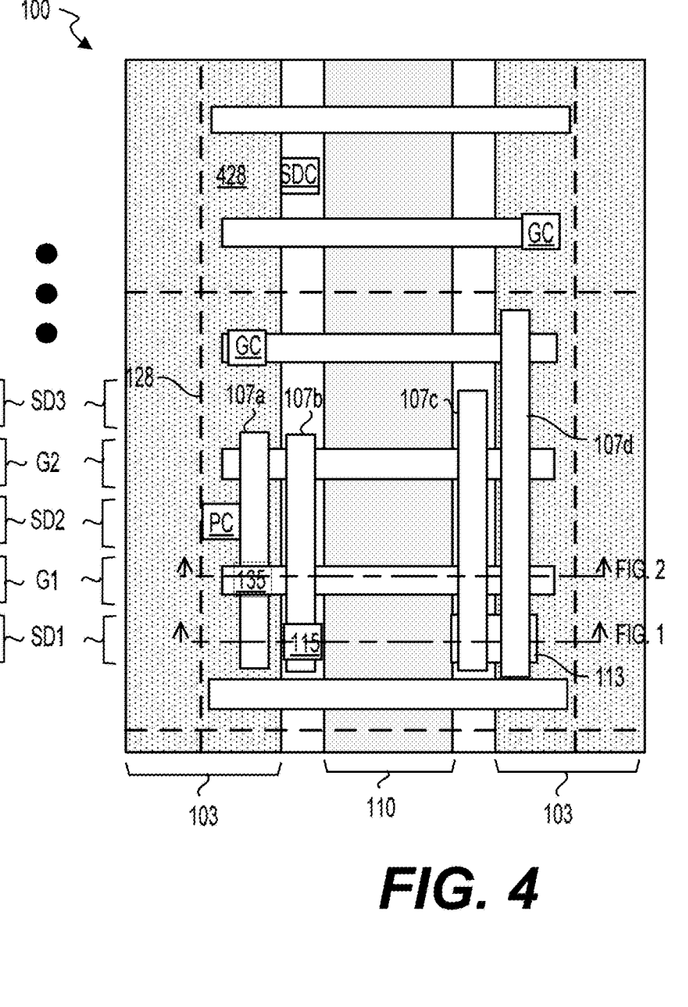
FIG. 4 is a top-down planar view of another horizontal section of the structure in FIGS. 1 and 2, in accordance with embodiments of the disclosure.

The use of the wiring tier and local interconnects discussed above enables connection of one or more devices in the lower tier 105 to one or more devices in the upper tier 109 to provide a monolithic 3D IC represented by the IC boundary 128 in FIGS. 1 and 2. As noted above, semiconductor devices within a tier may be arranged laterally along the surface of the substrate. In some embodiments, a device tier may include two or more semiconductor devices repeated laterally along the semiconductor surface to form a functional circuit or cell which may have a conventional planar cell layout. FIGS. 3 and 4 provide planar views of the IC of FIGS. 1 and 2, but further including repeating devices within a tier that extend the IC boundary 128 laterally along a direction of the substrate surface 101.

FIG. 3 is a top-down planar view of a horizontal section of the structure in FIGS. 1 and 2, in accordance with embodiments of the disclosure. As seen in FIG. 3, a layout of the IC 128 may include multiple source-drain tracks (SD1, SD2, SD3 . . . ) arranged alternately with multiple gate tracks (G1, G2 . . . ) along an east-west direction of the substrate. As known to those skilled in the art, these alternating SD and G regions form an array of semiconductor devices in the east-west direction of the substrate. As seen from the cross-section lines in FIGS. 1 and 2, the section in FIG. 3 is cut through the vertical interconnect 111 serving as an SD contact for a device in the lower tier 105, and through vertical interconnect 133 serving as a gate contact for a gate structure of the lower tier 105. Thus, in FIG. 3, vertical interconnect 111 is shown in the SD1 track to land on the horizontal interconnect 113 which is connected to the SD region of a device within the lower tier of devices 105. The SD1 track of FIG. 3 also shows horizontal interconnect 121 with the underlying power contact implemented by vertical interconnect 119 that lands on the power rail 103. Similarly, track G1 of FIG. 3 shows vertical interconnect 133 landing on the gate region 129. Additional example power contacts (PC), SD contacts (SDC) and gate contacts (GC) may be used as needed on additional SD and G tracks to form a complete functional circuit or cell, as shown in FIG. 3. Portions of adjacent cells 228, 328 and 428 are also shown to depict the repeating nature of cells across the substrate.

FIG. 4 is a top-down planar view of another horizontal section of the structure in FIGS. 1 and 2, in accordance with embodiments of the disclosure. As seen from the cross-section line in FIGS. 1, and 2, the section in FIG. 4 is cut through the vertical interconnect 115 serving as an SD contact for a device in the upper tier 109, and through vertical interconnect 135 serving as a gate contact for a gate structure of the upper tier 109. Thus, the SD1 track in FIG. 4 includes vertical interconnect 115 landing on the wiring track 107b, and also shows wiring tracks 107a, 107c and 107d without any connection to SD regions of the upper tier of devices 109. Similarly, the G1 track in FIG. 4 shows vertical interconnect 135 landing on wiring track 107a, while the wiring tracks 107b, 107c and 107d do not have any gate regions of the upper tier of devices 109. Elements below the wiring tier 107 are not shown in FIG. 4. Additional example power contacts (PC), SD contacts (SDC) and gate contacts (GC) may be used as needed on additional SD and G tracks to form a complete functional circuit or cell, as shown in FIG. 3.

Thus, techniques herein provide true monolithic integration of semiconductor devices in that designs include vertically integrated multi-layer devices of different functional types built in one continuous process flow enabled by superposition of all active devices in a single column. Such true columnar fabrication reduces manufacturing cost (because there is only single wafer processing) and improved density (use of self-aligned and fully-aligned vias throughout the integrated stack). Further transistor and gate wiring can be sandwiched (positioned) in-between device tiers to facilitate efficient routing without MIV (monolithic interlayer via). This aspect facilitates transistor-to-transistor and gate-to-gate wiring. Such wiring is more efficient (i.e. short wire-length, shallower vias, low RC) and provides access to the wiring plane from both device levels to improve transistor-to-transistor as well as gate-to-gate wiring.

As noted above, each tier of semiconductor devices may include vertically stacked semiconductor devices and/or laterally arranged semiconductor devices that are interconnected to form a functional circuit or cell. In some embodiments, each tier includes a stack of two or more semiconductor devices provided over one another, and such stack is repeated laterally along a surface of the substrate to form a complex cell for implementing a functional circuit, such as a logic circuit or memory circuit. Such tiers implementing functional cells may themselves be stacked to form complex monolithic 3D ICs providing heterogeneous functionality similar to conventional planar SOCs. One example may include a lower tier for implementing an AOI cell, a middle tier for implementing an XOR cell, and an upper tier for implementing an SRAM cell.

Figure 5:
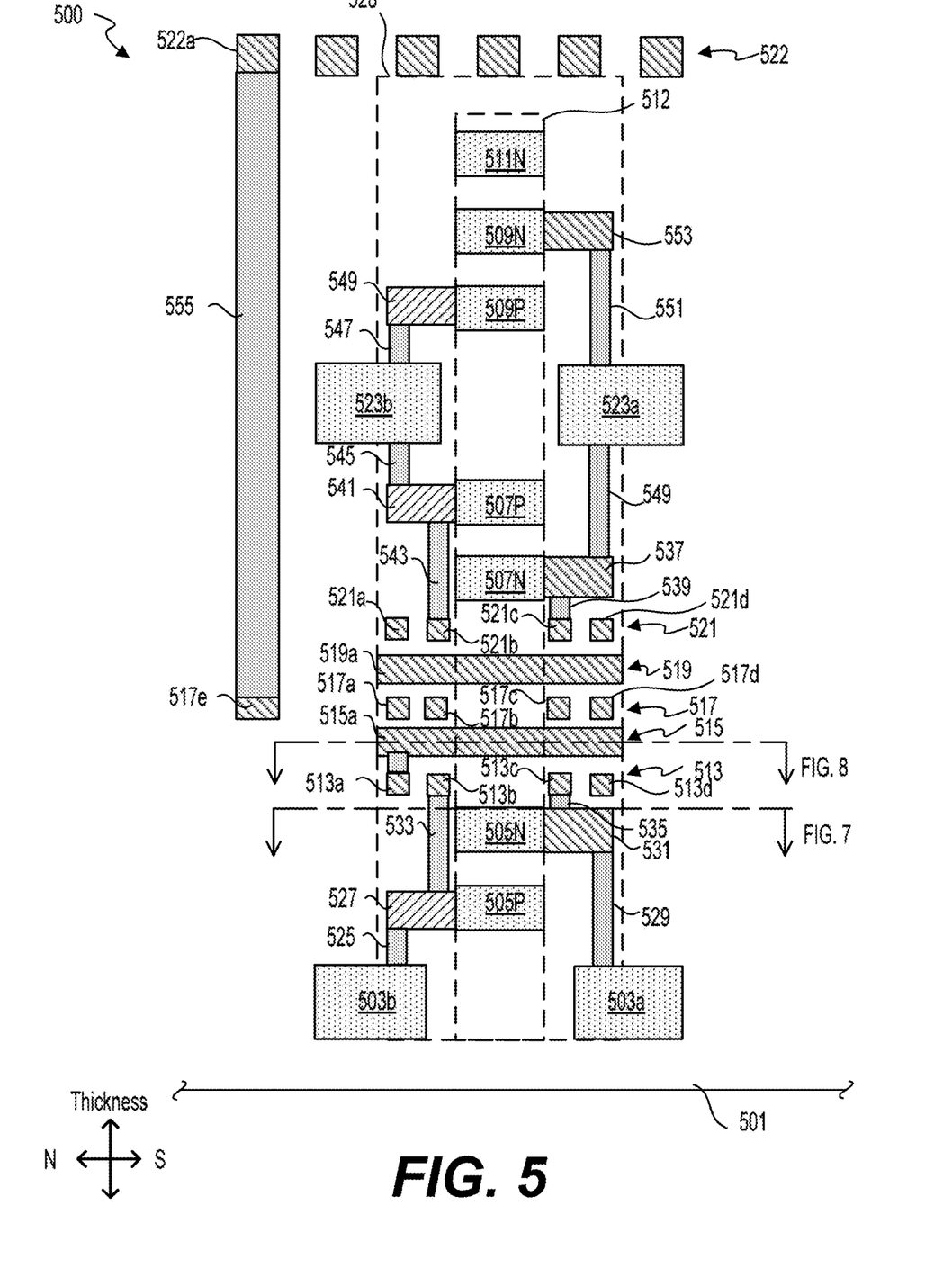
FIG. 5 is a vertical section view representing source-drain planes of another 3D IC, in accordance with embodiments of the present disclosure.

FIG. 5 is a vertical section view representing source-drain planes of 3D IC having three tiers, in accordance with embodiments of the present disclosure. The structure 500 represents a portion of a monolithic semiconductor substrate having a generally planar substrate surface 501. As seen, the structure 500 includes buried power rail 503a which serves as VSS delivering power to n-type transistors, and power rails 503b serving as VDD delivering power to p-type transistors. A first tier of transistors includes SD region 505P and SD region 505N of respective p-type and n-type devices, a second tier includes SD region 507N and SD region 507P of respective p-type and n-type devices, and a top tier includes SD region of device 509P, SD region of device 509N and SD region of device 511N. Thus, the lower and middle tiers include two stacked transistors each, while the upper tier includes three stacked transistors.

As seen in FIG. 5, the SD regions of the transistors are stacked collinearly within an active device column 512 of the structure. Stacked transistors in each tier may form a transistor pair including an n-type transistor and a p-type transistor that are stacked over one another to form a complementary pair of transistors. In the embodiment of FIG. 5, SD regions 505P and 505N form a complementary pair, SD regions 507N and 507P form a complementary pair, and SD regions 509P and 509N form another complementary pair. SD region 511P is part of a single transistor that has no complement within its tier. As seen, the stacked transistor pairs are configured in an alternating stack orientation by doping type of the transistors. In the embodiment of FIG. 5, SD region 505P is part of a p-type transistor, while its complement 505N is of an n-type transistor. Similarly, SD region 507N is of n-type and its complement 507P is of p-type. Finally, SD region 509P is of p-type and its complement 509N is of n-type. SD region 511N is part of an n-type transistor. This alternating of stack orientation (i.e. n-over-p, then p-over-n) improves implant and work-function deposition efficiency. Alternating orientation can improve process efficiency for implants and device type specific selective depositions as compared to maintaining a same stacking order for all device pairs in the stack (n-p n-p).

As seen in FIG. 5, the wiring tier includes five wiring layers 513, 515, 517, 519, and 521 positioned over one another in a direction of thickness of the substrate. Each wiring layer includes multiple wiring tracks that run generally parallel within a wiring layer, and generally perpendicular with respect to wiring tracks in an adjacent layer, as shown. Wiring layer 513 generally serves as an M0 metal layer for the lower tier of and includes four wiring tracks 513a, 513b, 513c, and 513d that extend in an east-west direction (i.e., perpendicular to the plane of the drawing page). Wiring layer 515 generally serves as M1 metal layer for the lower tier and includes multiple wire tracks that extend along a north-south direction. Thus, in FIG. 5 only track 515a is shown. Similarly, wiring layer 521 generally serves as an M0 metal layer for the middle tier of devices and includes four wiring tracks 521a, 521b, 521c, and 521d that extend in an east-west direction, while wiring layer 519 generally serves as M1 metal layer for the middle tier and includes multiple wire tracks that extend along a north-south direction, with only with track 519a is shown. Wiring layer 517 includes five wiring tracks 517a, 517b, 517c, 517d and 517e that extend in an east-west direction. Wiring layer 517 generally serves as an M2 metal layer for the lower and upper tiers, as well as to provide connections to global wiring layer 522 which generally provides connections between different cells of the structure 500. Structure 500 also includes intermediate power rails 523a and 523b positioned between the middle tier of devices (507P and 507N) and the lower tier of devices (505P and 505N) as shown.

Several local interconnects to electrically connect the semiconductor devices as necessary to form functional circuits. Specifically, within the lowest tier of devices, buried power rail 503b is connected to SD region 505P by way of vertical power interconnect 525 and horizontal interconnect 527, and buried power rail 503a is connected to SD region 505N by way of vertical power interconnect 529 and horizontal interconnect 531. Vertical interconnect 533 electrically connects the SD region 505P to wiring track 513b in wiring layer 513, and vertical interconnect 535 similarly connects the SD region 505N to wiring track 513c in wiring layer 513. Within the middle tier of devices, SD region 507N is connected to wiring track 521c of wiring layer 521 by way of horizontal interconnect 537 and vertical interconnect 539. Similarly, SD region 507P is connected to wiring track 521b of wiring layer 521 by way of horizontal interconnect 541 and vertical interconnect 543.

Intermediate power rail 523b delivers power to SD region 507P by way of vertical interconnect 545 and horizontal interconnect 541, while also delivering power to SD region 509P in the upper tier via vertical interconnect 547 and horizontal interconnect 549. Similarly, intermediate power rail 523a delivers power to SD region 507N by way of vertical interconnect 549 and horizontal interconnect 537, and delivers power to SD region 509N via vertical interconnect 551 and horizontal interconnect 553. As also seen, vertical interconnect 555 connects wiring track 517e to wiring track 522a in the global wiring tiervel.

Figure 6:
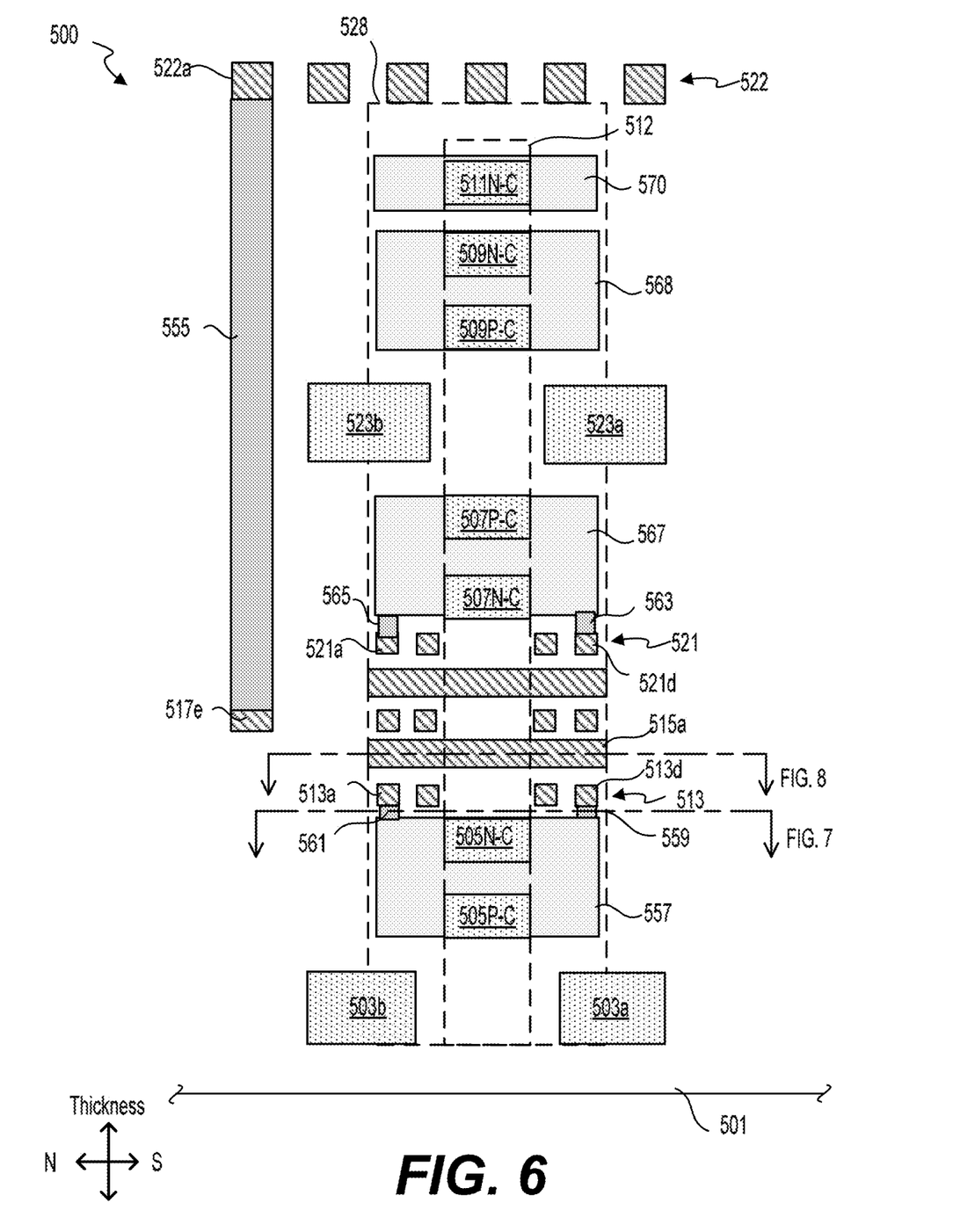
FIG. 6 is a vertical section view representing gate planes of the 3D IC of FIG. 5, in accordance with embodiments of the present disclosure.

FIG. 6 is a vertical section view representing gate planes of the 3D IC of FIG. 5, in accordance with embodiments of the present disclosure. The gate region section in FIG. 6 is located behind the source-drain plane of the device shown in FIG. 5. As seen, the structure 500 includes a gate region 557 associated with the lower tier of semiconductor devices, agate region 567 associated with the middle tier of semiconductor devices and gate region 568 associated with the upper tier of devices. Each of the gate regions is a common gate region shared by complementary transistors within the tier. Specifically, gate region 557 is a gate-all-around (GAA) structure which surrounds channel regions 505P-C and 5095N-C of the devices in the lower tier, and gate region 567 is a GAA structure which surrounds channel regions 507N-C and 507P-C of the devices in the middle tier as shown. Gate region 568 is a gate-all-around (GAA) structure which surrounds channel regions 509P-C and 509N-C of the devices in the upper tier. The channel 511P-C includes GAA structure 570, which serves as a passgate for an SRAM circuit implemented by the upper tier of three stacked transistors.

As seen in FIG. 6, vertical interconnect 559 electrically connects the wiring track 513d of wiring layer 513 to the gate region 557, and vertical interconnect 561 electrically connects the wiring track 513a of wiring layer 513 to the gate region 557. Similarly, vertical interconnect 563 electrically connects the wiring track 521 of wiring layer 521 to the gate region 567, and vertical interconnect 565 electrically connects the wiring track 521a to the gate region 567.

As noted above, each device tier of structure 500 includes vertically stacked semiconductor devices, with such stack repeated laterally along the substrate surface to form complex cells for implementing a functional circuit such as a memory or logic circuit. FIG. 5 is intended to depict several source-drain regions of FET devices laterally arranged behind one another along the east west direction within a tier of the IC. Similarly, FIG. 6 is intended to depict several gate or channel regions of FET devices laterally arranged behind one another along the east west direction within a tier of the IC. Thus, FIGS. 5 and 6 are not true cross-sections through a single plane that of the IC, but rather provide representational views of all source-drain regions and gate regions that would occupy different vertical planes in an actual physical device. Those skilled in the art would understand that two vertical interconnects shown to connect to the same SD region in FIG. 5 may represent vertical interconnects in different planes that connect to SD regions of different devices. Similarly, two vertical interconnects shown to connect to the same gate structure in FIG. 6 may represent two vertical interconnects in different planes that connect to gate structures of different devices.

Figure 7:
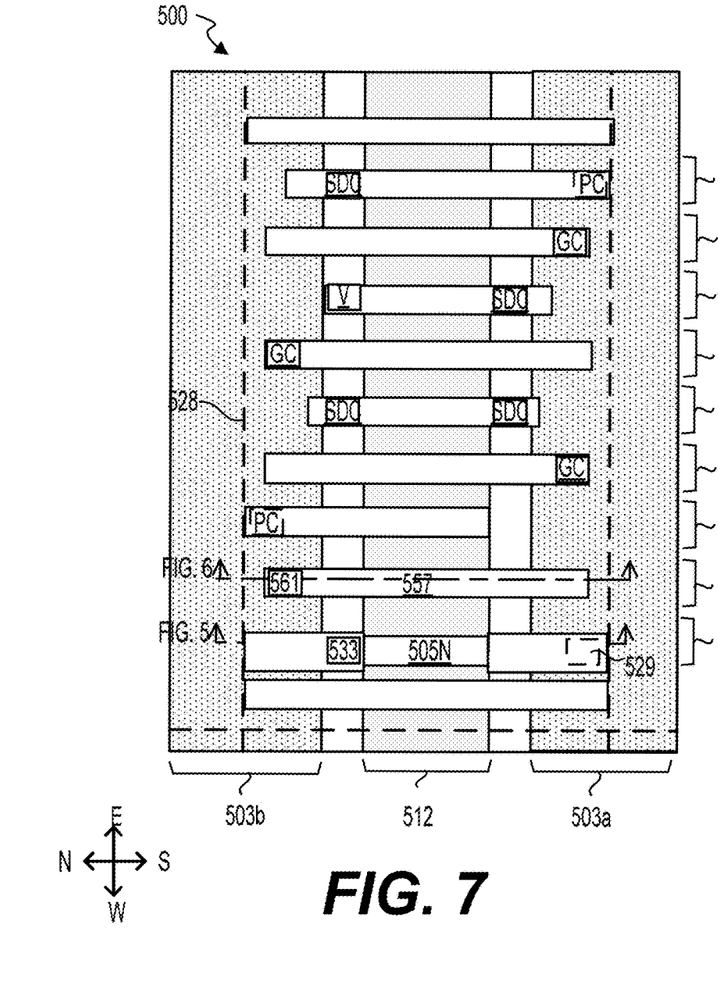
FIG. 7 is a top-down planar view of a horizontal section of the structure in FIGS. 5 and 6, in accordance with embodiments of the disclosure.
Figure 8:
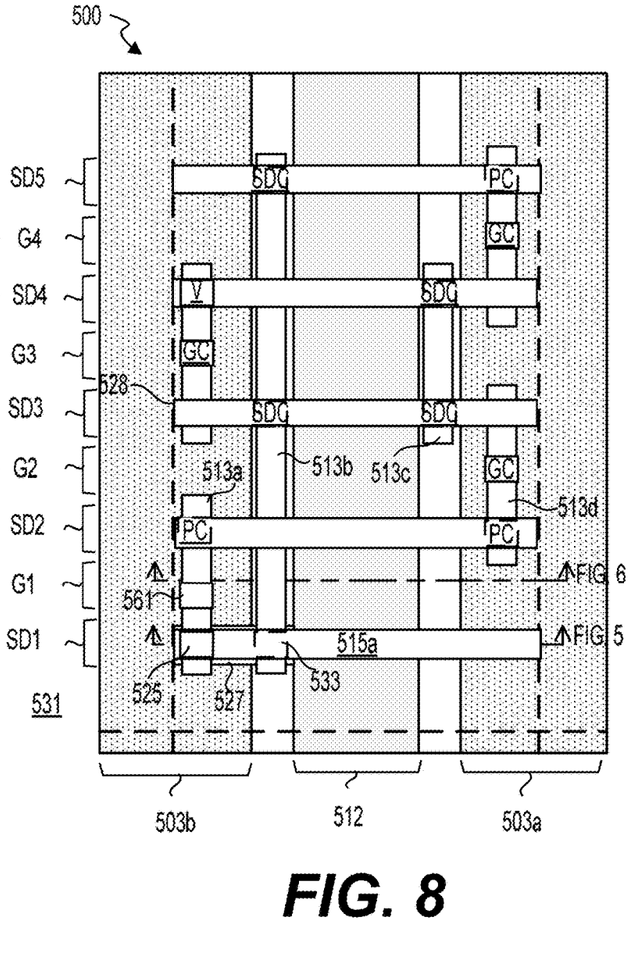
FIG. 8 is a top-down planar view of another horizontal section of the structure in FIGS. 5 and 6, in accordance with embodiments of the disclosure.

As also noted above, one example of the 3D IC of FIGS. 5 and 6 provides a lower tier implementing an AOI logic cell, a middle tier implementing an XOR logic cell, and an upper tier implementing an SRAM cell. FIGS. 7 and 8 provide planar views of the a lower tier of the IC of FIGS. 5 and 6 implementing an AOI22 logic cell formed of a plurality of stacked complementary FET devices, with the stacked complementary FETS repeated within the lower tier to extend the IC boundary 528 of the lower tier laterally along a direction of the substrate surface 101. Specifically, FIGS. 7 and 8 show the A, B, C and D complementary pairs of FETs arranged in that order along the west to east direction of the device. The Y output is provided at the common SD region of FETs B and C of the AOI22 logic cell.

FIG. 7 is a top-down planar view of a horizontal section of the structure in FIGS. 5 and 6, in accordance with embodiments of the disclosure. As seen from the cross-section lines in FIGS. 5 and 6, the section of FIG. 7 is cut through vertical interconnect 533, through the SD region of device 505N, through local interconnect 531, as well as through the gate region associated with device 505N. FIG. 8 is a top-down planar view of another horizontal section of the structure in FIGS. 5 and 6, in accordance with embodiments of the disclosure. As seen from the cross-sections noted in FIGS. 5 and 6, the section in FIG. 8 is cut through wiring track 515a. Those skilled in the art understand that G1, G2, G3 and G4 tracks provide gate inputs for A, B, C and D complementary FET devices of the AOI cell. Further, the SD1 and SD5 tracks provide discrete SD regions for the A and D FET devices respectively, while the SD2-SD4 tracks provide shared SD regions for all FET devices of the AOI22 cell. That is, SD2 provides a shared SD region for A and B FET devices, SD3 provides a shared SD region for B and C FET devices, SD4 provides a shared SD region for C and D FET devices. SD3 track additionally provides a Y output for the AOI22 cell.

With this layout understanding, it can be seen from FIGS. 7 and 8 that track SD1 of the AOI22 cell includes vertical interconnect 533 landing on the local interconnect 527 as shown in FIG. 7. This interconnect 533 provides an SD contact that reaches up from the p-FET portion 505P of AOI transistor A to the wiring track 513b in the M0 layer, as shown in FIG. 8. Track SD1 also shows the vertical interconnect 529 extending downward from the local interconnect 531 to the power rail 503a to provide a VSS power contact to the n-FET portion of AOI transistor A, as shown in FIG. 7. Contact 525 in FIG. 8 represents a short via connection for the wiring track 515a in the M0 layer to an M1 layer for the AOI cell.

As also seen from FIGS. 7 and 8, track G1 includes vertical interconnect 561 which reaches down to the gate region 557 to provide a common gate contact for n-FET and p-FET portions of AOI transistor A. This vertical interconnect 561 further reaches upward to make contact with wiring track 513a provide a gate input for AOI device A, as shown in FIG. 8. Additional source-drain contacts SDC, power contacts PC, gate contacts GC and vias V are shown in FIGS. 7 and 8 for providing electrical connection between A, B C and D complementary FET devices of the AOI22 cell.

Example structures and designs herein include two tiers of logic with four lateral gate-all-around devices stacked in complementary pairs with reversed stacking order (n-over-p below p-over-n in this non-limiting example). There is a tier/layer dedicated to SRAM with three lateral gate-all-around devices in a 2-over-1 arrangement (shown as two n-type over one p-type but can optionally be two p over one n). Devices are stacked collinearly, which enables monolithic fabrication. Power-rails are implemented as one VDD/VSS set in a buried power-rail set/positioned below a device plane and a secondary VDD/VSS is set in a space between a top logic tier and an SRAM tier.

Embodiments include one or more wiring levels embedded between two logic tiers. This example embodiment shows five wiring levels, but this can vary by design.

Designs can be arranged to keep a central active device region free of wiring obstructions. Designs include a vertical interconnect running down from the central wiring level to bottom logic devices and up to top logic device levels. A periodic deep vertical interconnect can be used to connect local wiring sandwiched between logic tiers with a global wiring above the device stack.

Thus techniques herein provide true monolithic integration of logic and memory in that designs include vertically integrated multi-layer logic and memory built in one continuous process flow enabled by superposition of all active devices in a single column. Such true columnar fabrication reduces manufacturing cost (because there is only single wafer processing) and improved density (use of self-aligned and fully-aligned vias throughout the integrated stack).

A stacked CFET (complimentary field effect transistor) herein has multiple levels of stacked complementary FET pairs each sharing a common transistor-gate.

Stack orientation can alternate (i.e. n-over-p, then p-over-n) to improve implant and work-function deposition efficiency. Alternating orientation can improve process efficiency for implants and device type specific selective depositions as compared to maintaining a same stacking order for all device pairs in the stack (n-p n-p).

Transistor and gate wiring can be sandwiched (positioned) in-between device levels to facilitate efficient routing without MIV (monolithic inter-layer via). This aspect facilitates transistor-to-transistor and gate-to-gate wiring. Such wiring is more efficient (i.e. short wire-length, shallower vias, low RC) access to the wiring plane from both device levels to improve transistor-to-transistor as well as gate-to-gate wiring.

Wiring tracks can surround active device regions. For wires running parallel to the gates, the wire tracks can be limited to run in the source-drain regions. For wires running perpendicular to gates, wires can run past the gate end-cap (i.e. the extension of the transistor gate past the active channel). This embodiment is beneficial because by optimizing wiring tracks to run outside the active gate region, a corresponding device stack can be manufactured from a single monolithic feature in a sequence of etch and deposition processes that are unimpeded by intermittent wires.

A "buried" power rail with replicated power-rail in-between logic and SRAM stack facilitates efficient power-delivery throughout the stack. The buried power rail can be positioned below an initial device level. Duplicating the power-rail below the device stack and above the logic stack (i.e. below the SRAM stack) ensures power delivery with improved IR drop and EM characteristics.

A three transistor CFET can be used for SRAM (two stacks for 6 transistor SRAM cell) on top of logic for efficient floorplan use. Providing a transistor stacking configuration optimized for SRAM (e.g. two pairs of n-n-p stacks) integrated with the logic stack allows not only for dense SRAM designs but also facilitates high-bandwidth, low power access to memory blocks from underlying logic.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A three-dimensional (3D) integrated circuit (IC) comprising:
    a substrate having a substrate surface;
    a power rail provided in the substrate;
    a first tier of semiconductor devices provided in the substrate and positioned over the power rail along a thickness direction of the substrate which is substantially perpendicular to said substrate surface;
    a wiring tier provided in the substrate and positioned over the first tier of semiconductor devices along the thickness direction, said wiring tier including at least one wiring level comprising a plurality of independent wiring tracks each extending in a direction along the substrate surface;
    a second tier of semiconductor devices provided in the substrate and positioned over the wiring tier along the thickness direction, the second tier of semiconductor devices being stacked on the first tier of semiconductor devices in the thickness direction such that the wiring tier is interposed between the first and second tiers of semiconductor devices;
    a first vertical interconnect structure extending downward from a first track of the plurality of independent wiring tracks and into the first tier of semiconductor devices along the thickness direction to electrically connect the first track to a device within the first tier of semiconductor devices; and
    a second vertical interconnect structure extending upward from a second track of the plurality of independent wiring tracks and into the second tier of semiconductor devices along the thickness direction to electrically connect the second track to a device within the second tier of semiconductor devices.

2. The 3D IC of claim 1 wherein said wiring tier comprises a plurality of wiring levels positioned over one another along the thickness direction of the substrate, said plurality of wiring levels including the at least one wiring level.

3. The 3D IC of claim 1, further comprising an intermediate power rail provided in the substrate and positioned over the power rail along the thickness direction of the substrate.

4. The 3D IC of claim 1, further comprising a third tier of semiconductor devices provided in the substrate and stacked on the second tier of semiconductor devices in the thickness direction.

5. The 3D IC of claim 4, further comprising an intermediate power rail provided in the substrate and positioned over the second tier of semiconductor devices such that the intermediate power rail is positioned between the second and third tiers of semiconductor devices along the thickness direction.

6. The 3D IC of claim 5, further comprising:
a first power connection structure extending upward from the power rail to the first tier of semiconductor devices along the thickness direction to electrically connect the power rail to the device within the first tier of semiconductor devices,
a second power connection structure extending downward from the intermediate power rail to the second tier of semiconductor devices along the thickness direction to electrically connect the intermediate power rail to the device within the second tier of semiconductor devices, and
a third power connection structure extending upward from the intermediate power rail to the third tier of semiconductor devices along the thickness direction to electrically connect the intermediate power rail to a device within the third tier of semiconductor devices.

7. The 3D IC of claim 4, wherein:
the first tier of semiconductor devices comprises a first stacked pair of complementary field effect transistors sharing a common gate structure,
the second tier of semiconductor devices comprises a second stacked pair of complementary field effect transistors sharing a common gate structure,
the third tier of semiconductor devices comprises:
a third stacked pair of complementary field effect transistors sharing a common gate structure, and
an additional transistor stacked over the third stacked pair of complementary field effect transistors; and
the first second and third stacked pairs of complementary field effect transistors are stacked in relation to one another.

8. The 3D IC of claim 7, wherein:
the first stacked pair of complementary field effect transistors has an n-over-p orientation,
the second stacked pair of complementary field effect transistors has a p-over-n orientation, and
the third stacked pair of complementary field effect transistors has an n-over-p orientation.

9. The 3D IC of claim 8, wherein the third tier of semiconductor devices further comprises an n-type field effect transistor stacked on the third stacked pair of complementary field effect transistors.

10. The 3D IC of claim 9, wherein:
the first tier of semiconductor devices comprises a first logic circuit,
the second tier of semiconductor devices comprises a second logic circuit, and
the third tier of semiconductor devices comprises a memory circuit.

11. The 3D IC of claim 10, wherein:
the first logic circuit is an And-Or-Inverter (AOI) circuit,
the second logic circuit is an Exclusive-Or (XOR) circuit, and
the memory circuit is an SRAM circuit.

12. A three-dimensional (3D) integrated circuit (IC) comprising:
a substrate having a substrate surface;
a power rail provided in the substrate;
a first tier of semiconductor devices provided in the substrate and positioned over the power rail along a thickness direction of the substrate which is substantially perpendicular to said substrate surface;
a wiring tier provided in the substrate and positioned over the first tier of semiconductor devices along the thickness direction;
a second tier of semiconductor devices provided in the substrate and positioned over the wiring tier along the thickness direction, the second tier of semiconductor devices being stacked on the first tier of semiconductor devices in the thickness direction such that the wiring tier is interposed between the first and second tiers of semiconductor devices;
a first vertical interconnect structure extending downward from the wiring tier to the first tier of semiconductor devices along the thickness direction to electrically connect the wiring tier to a device within the first tier of semiconductor devices; and
a second vertical interconnect structure extending upward from the wiring tier to the second tier of semiconductor devices along the thickness direction to electrically connect the wiring tier to a device within the second tier of semiconductor devices wherein:
said first tier of semiconductor devices comprises a first transistor pair including an n-type transistor and a p-type transistor that are stacked over one another, and
said second tier of semiconductor devices comprises a second transistor pair including an n-type transistor and a p-type transistor that are stacked over one another.

13. The 3D IC of claim 12, wherein the first transistor pair and the second transistor pair are configured in an alternating stack orientation.

14. The 3D IC of claim 12 wherein:
said first transistor pair further comprises a first common gate structure, and
said second transistor pair further comprises a second common gate structure.

15. A three-dimensional (3D) integrated circuit (IC) comprising:
a substrate having a substrate surface;
a power rail provided in the substrate;
a first tier of semiconductor devices provided in the substrate and positioned over the power rail along a thickness direction of the substrate which is substantially perpendicular to said substrate surface;
a wiring tier provided in the substrate and positioned over the first tier of semiconductor devices along the thickness direction;
a second tier of semiconductor devices provided in the substrate and positioned over the wiring tier along the thickness direction, the second tier of semiconductor devices being stacked on the first tier of semiconductor devices in the thickness direction such that the wiring tier is interposed between the first and second tiers of semiconductor devices;

a first vertical interconnect structure extending downward from the wiring tier to the first tier of semiconductor devices along the thickness direction to electrically connect the wiring tier to a device within the first tier of semiconductor devices; and a second vertical interconnect structure extending upward from the wiring tier to the second tier of semiconductor devices along the thickness direction to electrically connect the wiring tier to a device within the second tier of semiconductor devices, wherein:

devices in each of the first and second tier of semiconductor devices are stacked collinearly along the thickness direction to define an active device column, and said first and second vertical interconnects are provided outside of said active device column.

16. The 3D IC of claim 15, wherein:

said active device column extends along the substrate surface of the substrate to define an active device region of the substrate surface, and said wiring tier comprises a plurality of wiring tracks that substantially surround the active device region of the substrate surface.

17. The 3D IC of claim 16 wherein the plurality of wiring tracks comprise first wiring tracks provided within source-drain regions of the active device region and which extend along the substrate surface in substantially parallel relation to gate regions of the active device region.

18. The 3D IC of claim 17 wherein the plurality of wiring tracks further comprise second wiring tracks which extend along the substrate surface in substantially perpendicular relation to the gate regions of the active device region.

\* \* \* \* \*